United States Patent
Miyazawa et al.

(10) Patent No.: US 7,238,978 B2
(45) Date of Patent: Jul. 3, 2007

(54) FERROELECTRIC MEMORY DEVICE

(75) Inventors: Hiromu Miyazawa, Toyoshina-machi (JP); Takamitsu Higuchi, Matsumoto (JP); Setsuya Iwashita, Nirasaki (JP)

(73) Assignee: Seiko Epson Corporation, Tokyo (JP)

(*) Notice: Subject to any disclaimer, the term of this patent is extended or adjusted under 35 U.S.C. 154(b) by 311 days.

(21) Appl. No.: 10/867,812

(22) Filed: Jun. 16, 2004

(65) Prior Publication Data

US 2005/0017269 A1    Jan. 27, 2005

(30) Foreign Application Priority Data

Jun. 18, 2003    (JP)    ............................ 2003-173247

(51) Int. Cl.
*H01L 29/82*    (2006.01)
(52) U.S. Cl. ................ 257/295; 365/145; 365/E21.664
(58) Field of Classification Search ................ 257/295, 257/E21.664
See application file for complete search history.

(56) References Cited

U.S. PATENT DOCUMENTS

| | | | |
|---|---|---|---|
| 5,912,068 A * | 6/1999 | Jia | .............................. 428/210 |
| 6,312,819 B1 * | 11/2001 | Jia et al. | ..................... 428/450 |
| 2004/0036571 A1 * | 2/2004 | Chen et al. | ............... 338/32 R |

FOREIGN PATENT DOCUMENTS

JP    A 2001-210794    8/2001

OTHER PUBLICATIONS

Wang et al., "Epitaxial BiFeO₃ Multiferroic Thin Film Heterostructures," Science, vol. 299, pp. 1719-1722, Mar. 14, 2003.

* cited by examiner

*Primary Examiner*—Jerome Jackson
(74) *Attorney, Agent, or Firm*—Oliff & Berridge, PLC

(57) ABSTRACT

A ferroelectric memory device has a high performance, includes no Pb, and can be directly mounted onto an Si substrate. The ferroelectric memory device includes a (001)-oriented $BiFeO_3$ ferroelectric layer 5 with a tetragonal structure, which is formed on an electrode 4 made of a perovskite material formed on an Si oxide film. The electrode 4 with a perovskite structure is formed by an ion beam assist method.

11 Claims, 6 Drawing Sheets

FERROELECTRIC MEMORY DEVICE

BACKGROUND OF THE INVENTION

1. Field of the Invention

This invention relates to a ferroelectric memory device including a $BiFeO_3$ ferroelectric layer.

Priority is claimed on Japanese Patent Application No. 2003-173247, filed Jun. 18, 2003, the content of which is incorporated herein by reference.

2. Description of Related Art

Ferroelectric materials are beginning to be put to practical use as recording materials in nonvolatile memory devices because they have a large capacity and low power consumption. $Pb(Zr_{1-x}Tu_x)O_3$ (PZT) which is a perovskite-type oxide and $SrBi_2Ta_2O_9$ (SBT) which is a Bi layered compound are representatives of ferroelectric materials used in nonvolatile memory devices. For a nonvolatile memory device using such ferroelectric materials, namely a ferroelectric memory device, it is expected that its dielectric polarization moment and Curie temperature (transition temperature from paraelectric to ferroelectric), which are characteristics of the device, are large and high.

For example, it is expected, for better sensitivity of a sense amplifier, that its residual dielectric polarization moment Pr is at least larger than $10\ \mu C/cm^2$. Especially, the dielectric polarization moment is expected to be even larger for a memory device with a higher density including a capacitor with a smaller area than that of capacitors in existing devices. From the viewpoint of reliability of recorded data, the Curie temperature is expected to be more than 200° C. Especially, recording materials are expected to be able to hold memory near the operating temperature range (e.g., from −10° C. to +100° C.), that is, it is expected that structural phase transition does not occur in the temperature range of the recording materials. Additionally, it is necessary that the materials can record and reproduce data repeatedly more than $10^{12}$ times, preferably $10^{15}$ times. From the viewpoint of future miniaturization, the thickness of the recording film (ferroelectric layer) is expected to be 50-200 nm, followed by 10-50 nm. In this case, leak current through the ferroelectric layer is expected to be as low as $10^{-8}$-$10^{-6}\ A/cm^2$ at the time of a 100 kV/cm application.

Ferroelectric materials belonging to the PZT family exhibits a large dielectric polarization moment, e.g., 30-50 $\mu C/cm^2$, and have a Curie temperature of more than 400° C. and therefore the structural phase transition does not occur in the operating temperature range of the materials. However, composition control of Pb is difficult because Pb can easily evaporate from the ferroelectric layers. Additionally, the evaporation of Pb leads to deterioration of the environment because Pb is harmful thereto. For these reasons, production of ferroelectric memory devices including these materials needs to be reviewed.

Ferroelectric materials belonging to the SBT family exhibits a dielectric polarization moment of 20 $\mu C/cm^2$ at maximum. However, its orientation control in the materials is difficult because of a layered structure, and miniaturization of devices made of these materials is difficult because of the existence of crystal grains in the materials. Additionally, the materials are damaged by hydrogen at the time of formation of a passivation film in a post-process. Under these circumstances, $BaTiO_3$ is also one promising ferroelectric material. This material exhibits a dielectric polarization moment of 30 $\mu C/cm^2$ along the c-axis at room temperature. $BaTiO_3$ has a low Curie temperature of 120° C. and therefore structural phase transition from the tetragonal phase to the orthorhombic phase occurs near 0° C. in the materials. Since $BaTiO_3$ has such a transition temperature near the operating temperature, the value of the dielectric polarization moment is unstable and the materials may degrade easily with the structural phase transition.

In light of these circumstances, $BiFeO_3$ is proposed as a new ferroelectric material for a ferroelectric memory device (see, e.g., Japanese Unexamined Patent Application, First Publication No. 2001-210794). It has been confirmed in recent reports that $BiFeO_3$ has a high ferroelectric characteristic of dielectric polarization moment of 60-70 $\mu C/cm^2$ (see, e.g., Science, Vol. 299, 1719-1721, 2003). In the article in Science, upper and lower electrodes between which a ferroelectric layer is sandwiched are made of $SrRuO_3$, and the ferroelectric layer made of $BiFeO_3$ has a perovskite structure in a tetragonal system.

Recently the demand for high performance and high-density integration of semiconductor devices is increasing. Accordingly, the high performance is demanded also for a ferroelectric memory device, and additionally, directly mounting onto a Si substrate or implementation to a Si substrate is expected. For this reason, $BiFeO_3$ is thought to be a very promising candidate for a ferroelectric material because it has a high ferroelectric characteristic as described above, and does not contain Pb that is detrimental to the environment.

However, there is a problem to be solved in a ferroelectric memory device using $BiFeO_3$, that is, it is very difficult to directly implement the ferroelectric memory device including a lower electrode on an Si substrate. This is because normally a natural oxide film is formed on an Si substrate, and it is difficult to make a lower electrode film and a $BiFeO_3$ film grow epitaxially on the natural oxide film. For this reason, under the existing circumstances, implementation of a ferroelectric memory device using $BiFeO_3$ with a tetragonal structure on an Si substrate has not been realized yet.

In view of these circumstances, the purpose of the present invention is to provide a ferroelectric memory device which has high performance and does not contain Pb and which is directly implementable on an Si substrate.

SUMMARY OF THE INVENTION

In order to resolve the above-described problem, the present invention provides a ferroelectric memory device including an Si oxide film, an electrode made of a perovskite material and formed on the Si oxide film, and a (001)-oriented $BiFeO_3$ ferroelectric layer with a tetragonal structure formed on the electrode. According to this ferroelectric memory device, it is possible to directly mount a ferroelectric memory device including a ferroelectric layer onto an Si substrate because a $BiFeO_3$ ferroelectric layer can grow epitaxially on an electrode made of a perovskite material (material having a perovskite structure) formed on an Si oxide film. The ferroelectric memory device has a (001)-oriented $BiFeO_3$ layer with a tetragonal structure as a ferroelectric layer, which has a high ferroelectric characteristic such as a high dielectric polarization moment, and therefore the memory device has a high performance and is environmentally preferable because of no inclusion of Pb therein.

In the ferroelectric memory device, it is preferable that the electrode made of a perovskite or perovskite-type material be formed by an ion beam assist deposition method. According to this ferroelectric memory device, the electrode made of a perovskite-type material can grow epitaxially with ease, for example, on a natural oxide film on an Si substrate.

In the ferroelectric memory device, it is preferable that the electrode made of a perovskite-type material be epitaxially grown with a (100)-orientation. According to this ferroelectric memory device, a (001)-oriented $BiFeO_3$ ferroelectric layer with a tetragonal structure can grow epitaxially with good quality on the electrodes.

In the ferroelectric memory device, it is preferable that the electrode made of a perovskite-type material be made of at least one of $SrRuO_3$, Nb—$SrTiO_3$, La—$SrTiO_3$, and (La, Sr)$CoO_3$. According to this ferroelectric memory device, a (001)-oriented $BiFeO_3$ layer with a tetragonal structure can grow with good quality on the electrodes.

In the ferroelectric memory device, it is preferable that the electrode made of a perovskite-type material be formed on a buffer layer which is formed on the substrate by an ion beam assist deposition method. According to this ferroelectric memory device, since a buffer layer is formed on the substrate by an ion beam assist deposition method, the buffer layer can grow epitaxially with good quality on a natural oxide film grown on the Si substrate and therefore an electrode made of a perovskite material can grow epitaxially with good quality on the buffer layer.

In the ferroelectric memory device, it is preferable that the buffer layer be epitaxially grown with a (100)-orientation. According to this ferroelectric memory device, an electrode made of a perovskite material with a (100)-orientation can grow epitaxially with good quality on the buffer layer.

In the ferroelectric memory device, it is preferable that the $BiFeO_3$ ferroelectric layer has a perovskite structure, in which some Fe atoms located at B-sites in the structure are substituted by magnetic metal atoms. It is preferable that the magnetic metal atoms be at least one selected from the group of Mn, Ru, Co, and Ni. According to this ferroelectric memory device, the magnetism of the $BiFeO_3$ ferroelectric layer is strengthened and its dielectric characteristic improves, which results in higher performance of the ferroelectric memory device.

In the ferroelectric memory device, it is preferable that the magnetic metal atoms be substituted for 1-10% of Fe atoms located at all of the B-sites in the $BiFeO_3$ ferroelectric layer. In the case of less than 1%, these substitutions cannot improve the magnetism very much, and in the case of more than 10%, it is not expected that these substitutions can improve the magnetism more than that of case of less than 10%.

In this ferroelectric memory device, it is preferable that the $BiFeO_3$ ferroelectric layer has a perovskite structure, in which some Fe atoms located at B-sites are substituted by metal atoms whose valencies are higher than that of Fe. It is preferable that the metal atoms whose valencies are higher than that of Fe be at least one selected from the group of V, Nb, Ta, W, Ti, Zr, and Hf. In the perovskite structure of $BiFeO_3$, Bi atoms located at A-sites in the structure evaporate easily and accordingly defects occur at the A-sites. In a $BiFeO_3$ crystal in which there are defects missing Bi atoms at A-sites in the structure, a current leaks easily through this crystal because the $BiFeO_3$ crystal is no longer electrically neutral and no longer electrically insulated. According to this ferroelectric memory device, since some Fe atoms located at B-sites are substituted by metal atoms whose valencies are higher than that of Fe, the $BiFeO_3$ crystal can be maintained to be neutral and insulated in the entire crystal, which results in the prevention of the current leakage.

In this ferroelectric memory device, it is preferable that the metal atoms whose valencies are higher than Fe be substituted for 1-30% of Fe atoms located at all of the B-sites in the $BiFeO_3$ ferroelectric layer. In the case of less than 1%, these substitutions cannot improve sufficiently the effect of preventing the current leakage, and in the case of more than 30%, it cannot be expected that these substitutions can improve the effect of preventing the current leakage more than that of the case of less than 30%.

The present invention provides a ferroelectric memory device including an electrode with a (111)-orientation and a (111)-oriented $BiFeO_3$ ferroelectric layer with a rhombohedral structure formed on the electrode. According to this ferroelectric memory device, it is possible to directly mount a ferroelectric memory device including a ferroelectric layer onto an Si substrate because the $BiFeO_3$ ferroelectric layer can grow epitaxially on an electrode with a (111)-orientation which can grow epitaxially, for example, on a natural oxide film grown on the Si substrate. The ferroelectric memory device has a (111)-oriented $BiFeO_3$ ferroelectric layer with a rhombohedral structure as a ferroelectric layer, which has a high ferroelectric characteristic, such as a high dielectric polarization moment, which is similar to that of a (001)-oriented $BiFeO_3$ ferroelectric layer with a tetragonal structure, and therefore the memory device has a high performance and is environmentally preferable because of no inclusion of Pb therein.

In the ferroelectric memory device, the electrode with a (111)-orientation can be formed of Pt with a (111)-orientation. According to this ferroelectric memory device, a Pt film grows with a (111)-orientation regardless of the film formation method, therefore, an electrode can be easily formed, for example, by a rather simpler method such as sputtering.

In the ferroelectric memory device, the electrode with a (111)-orientation can have a perovskite structure. According to this ferroelectric memory device, a (111)-oriented $BiFeO_3$ layer with a perovskite structure can grow epitaxially with good quality on the electrode.

In the ferroelectric memory device, an electrode with a (111)-orientated perovskite structure can be epitaxially grown by an ion beam assist deposition method. According to this ferroelectric memory device, the electrode made of a perovskite material can grow epitaxially with ease, for example, on a natural oxide film grown on an Si substrate.

In the ferroelectric memory device, it is preferable that the electrode be made of at least one of $SrRuO_3$, Nb—$SrTiO_3$, La—$SrTiO_3$, and (La, Sr)$CoO_3$. According to this ferroelectric memory device, a (111)-oriented $BiFeO_3$ ferroelectric layer with a rhombohedral structure can grow epitaxially with ease on the electrode.

In the ferroelectric memory device, it is preferable that the $BiFeO_3$ ferroelectric layer has a perovskite structure, in which some Fe atoms located at B-sites in the structure are substituted by magnetic metal atoms. It is preferable that the magnetic metal atoms be at least one selected from the group of Mn, Ru, Co, and Ni. According to this ferroelectric memory device, the magnetism of the $BiFeO_3$ ferroelectric layer is strengthened and its dielectric characteristic improves, which result in higher performance of the ferroelectric memory device.

In the ferroelectric memory device, it is preferable that the magnetic metal atoms be substituted for 1-10% of Fe atoms located at all of the B-sites in the $BiFeO_3$ ferroelectric layer. In the case of less than 1%, the substitution cannot improve the magnetism very much, and in the case of more than 10%, it is cannot be expected that the substitution can improve the magnetism more than that of the case of less than 10%.

In the ferroelectric memory device, it is preferable that the $BiFeO_3$ ferroelectric layer has a perovskite structure, in which some Fe atoms located at B-sites are substituted by metal atoms whose valencies are higher than that of Fe. It is preferable that the metal atoms whose valencies are higher than that of Fe be at least one selected from the group of V, Nb, Ta, W, Ti, Zr, and Hf. In the perovskite structure of $BiFeO_3$, Bi atoms located at A-sites in the structure evaporate easily and accordingly defects occur at the A-sites. In a $BiFeO_3$ crystal in which there are defects of missing Bi atoms at A-sites in the structure, a current leaks easily through this crystal because the $BiFeO_3$ crystal is no longer electrically neutral and no longer electrically insulated. According to this ferroelectric memory device, since some Fe atoms located at B-sites are substituted by metal atoms whose valencies are higher than that of Fe, the $BiFeO_3$ crystal can be maintained neutral and insulated in the entire crystal, which results in the prevention of the current leakage.

In the ferroelectric memory device, it is preferable that the metal atoms whose valencies are higher than Fe be substituted for 1-30% of Fe atoms located at all of the B-sites in the $BiFeO_3$ ferroelectric layer. In the case of less than 1%, the substitution cannot sufficiently improve the prevention of the current leakage, and in the case of more than 30%, it cannot be expected that the substitution can improve the prevention of the current leakage more than that of the case of less than 30%.

DETAILED DESCRIPTION OF THE INVENTION

Hereinafter, ferroelectric memory devices of the present invention are described in detail.

Figure 1:
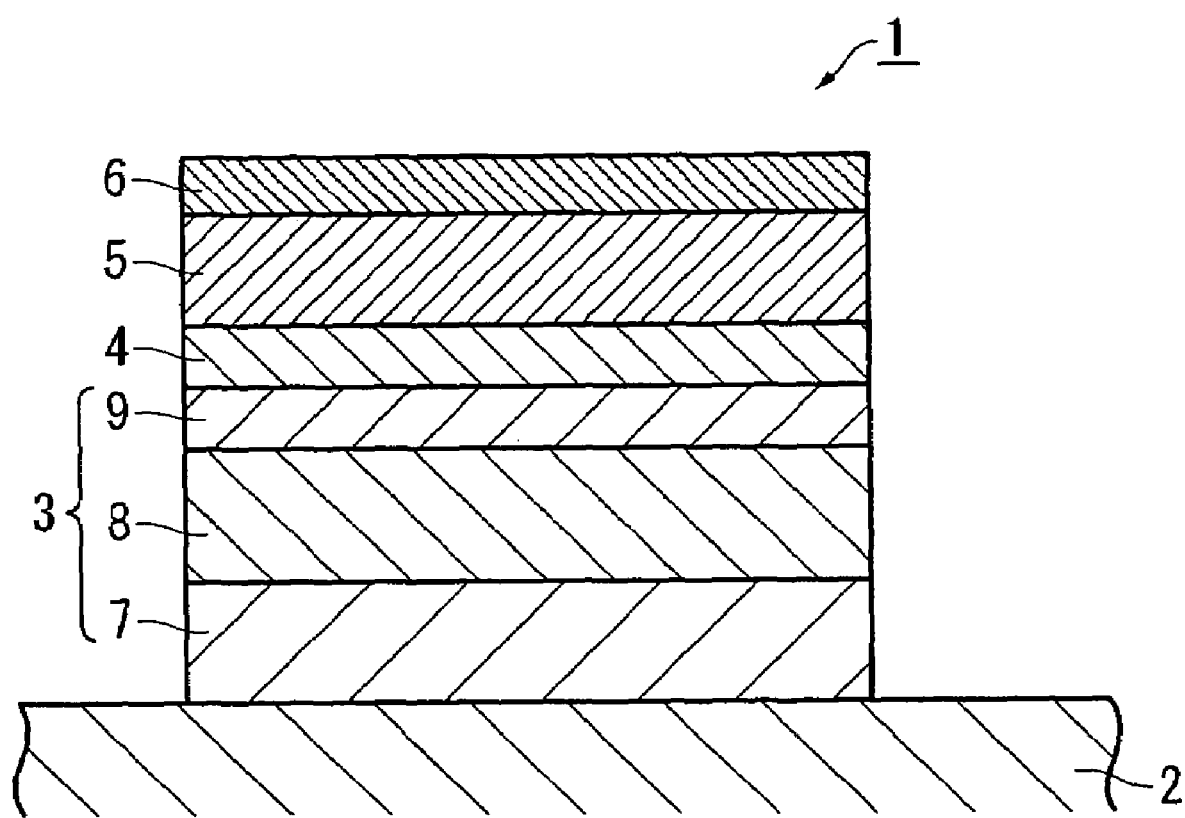
FIG. 1 shows a cross section of an embodiment of a ferroelectric memory device of the present invention.

FIG. 1 shows a schematic illustration of an embodiment of a ferroelectric memory device of the present invention, where reference number 1 shows a ferroelectric memory device. The ferroelectric memory device 1 is formed on a (100)-plane of a silicon (Si) substrate 2, and includes a buffer layer 3 formed on the Si substrate 2, a lower electrode 4 formed on the buffer layer 3, a ferroelectric layer 5 formed on the lower electrode 4, and an upper electrode 6 formed on the ferroelectric layer 5.

A layer formed of grains with a single orientation, i.e., only with an orientation parallel to the through-thickness of a layer, can be used as the buffer layer 3, and it is preferable that the grains in the buffer layer also have a planer orientation, i.e., the grains have orientations in all three-dimensions. This is because good bonding or adhesion between the Si substrate 2 with a natural oxide film thereon and the lower electrode 4 described later can be attained by including the buffer layer 3. It is preferable that this buffer layer 3 includes at least one of metal oxides with an NaCl structure, metal oxides with a fluorite structure, and metal oxides with a perovskite structure, and it is especially preferable that the buffer layer 3 be formed of a layered structure of a metal oxide with an NaCl structure or a metal oxide with a fluorite structure, and a metal oxide with a perovskite structure. This is because the lattice mismatch between a metal oxide with an NaCl structure or a metal oxide with a fluorite structure and a metal oxide with a perovskite structure is small, and therefore it is advantageous to form a layer with a perovskite structure on which the lower electrode 4, especially with a perovskite structure is formed, as described later.

For this reason, the buffer layer 3 of the present embodiment is formed from a first buffer layer 7 and a second buffer layer 8, both of which are made of a metal oxide with an NaCl structure or a metal oxide with a fluorite structure, and a third buffer layer 9 made of a metal oxide with a perovskite structure formed on the second buffer layer 8. The first buffer layer 7 is a component of the buffer layer of the present invention, and can be made of yttrium stabilized zirconia (YSZ) with a cubic system with a (100)-orientation, e.g., of a thickness of 100 nm. A YSZ expressed by the following formula can be used;

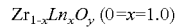

(Ln:Y, La, Ce, Pr, Nd, Sm, Eu, Gd, Tb, Dy, Ho, Er, Tm, Yb, Lu)

This first buffer layer 7 is directly formed on the Si substrate 2, where a natural oxide ($SiO_2$) is usually grown on the surface of the Si substrate 2. It is difficult to grow an epitaxial layer of YSZ on this natural oxide by usual film formation methods. For this reason, in this embodiment, the first buffer layer 7 can grow epitaxially especially by an ion beam assist deposition method, described later. It is allowable that the natural oxide film grown on the Si substrate 2 is an amorphous film. The second buffer film 8 can be made of $CeO_2$ with a cubic system with a (100)-orientation, e.g., of a thickness of 100 nm, which is grown epitaxially on the first buffer layer 7.

Materials for the first buffer layer 7 or the second buffer layer 8 are not restricted to YSZ or $CeO_2$, and can be a metal oxide with an NaCl structure or a metal oxide with a fluorite structure. MgO, CaO, SrO, BaO, MnO, FeO, CoO, NiO and solid solutions including these compounds are representatives of a metal oxide with an NaCl structure, and it is preferable that MgO, CaO, SrO, BaO or solid solutions including one of these compounds, among these, be used. Lattice mismatches between these metal oxides with an NaCl structure and a metal oxide with a perovskite structure are very small. In the case that MgO is used in place of YSZ, the first buffer layer 7 has a thickness of 20 nm, for example.

YSZ, $CeO_2$, $ZrO_2$, $ThO_2$, $UO_2$, and solid solutions including these compounds are representatives of a metal oxide with a fluorite structure, and it is preferable that at least one of YSZ, $CeO_2$, $ZrO_2$ and solid solutions including one of these compounds, among these, be used. Lattice mismatches between these metal oxides with a fluorite structure and a metal oxide with a perovskite structure are very small.

The third buffer layer 9 can be made of $YBa_2Cu_3O_x$ (e.g., x is 7), which is a layered oxide with a perovskite structure, and grown epitaxially on the second buffer layer 8 with an orthorhombic system with a (001)-orientation, e.g., of a thickness of 30 nm. Since the third buffer layer 9 is made of a metal oxide with a perovskite structure, a lattice mismatch between the third buffer layer 9 and the second buffer layer 8 is very small. Therefore, a film with substantially no defects in the crystal structure can grow, and a lower electrode 4 with a perovskite structure can grow epitaxially on this third buffer layer 9. Materials for the third buffer layer 9 are not restricted to $YBa_2Cu_3O_x$ (e.g., x is 7), and can be another metal oxide with a perovskite structure. $CaRuO_3$, $SrRuO_3$, $BaRuO_3$, $SrVO_3$, (La, Sr)$MnO_3$, (La, Sr)$CrO_3$, (La, Sr)$CoO_3$, or solid solutions including these compounds can be used.

The lower electrode 4 as an electrode in the present invention, is made of a metal oxide with a perovskite structure which is the same as that of the third buffer layer 9, and is grown epitaxially with a pseudo cubic system with a (100)-orientation, e.g., of a thickness of 50 nm. The same compounds which can be used for the third buffer film 9 can be applied as a metal oxide with a perovskite structure of which the lower electrode 4 is made, and at least one of $SrRuO_3$, Nb—$SrTiO_3$, La—$SrTiO_3$, and (La, Sr)$CoO_3$ can be preferably used, where Nb—$SrTiO_3$ is $SrTiO_3$ doped with Nb, and La—$SrTiO_3$ is $SrTiO_3$ doped with La. Since these compounds have high electric conductivity and high chemical stability, the lower electrode 4 made of these compounds has high electric conductivity and high chemical stability. Additionally, a (001)-oriented $BiFeO_3$ layer with a tetragonal structure can grow with good quality on the electrode 4. In this embodiment, $SrRuO_3$ with a pseudo cubic system with a (100)-orientation is used.

Figure 2A:
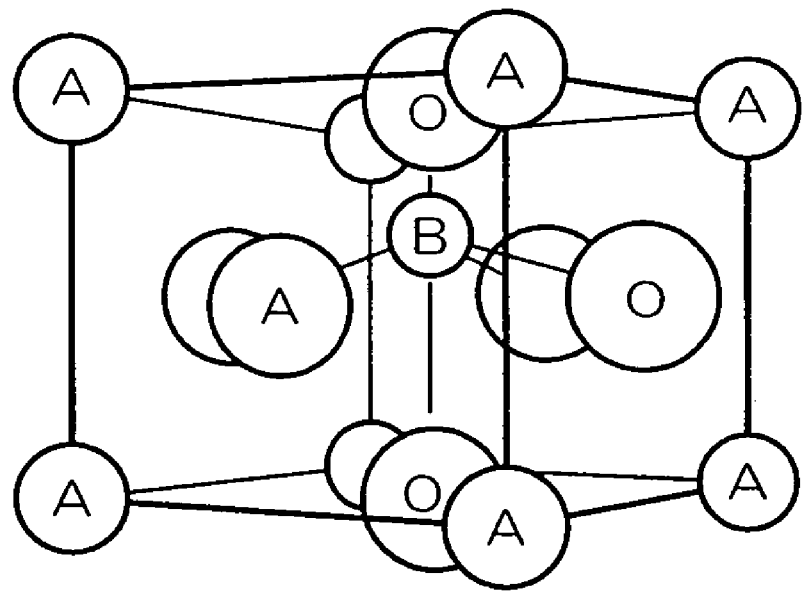
FIGS. 2A and 2B show schematic illustrations of a perovskite structure.
Figure 2B:
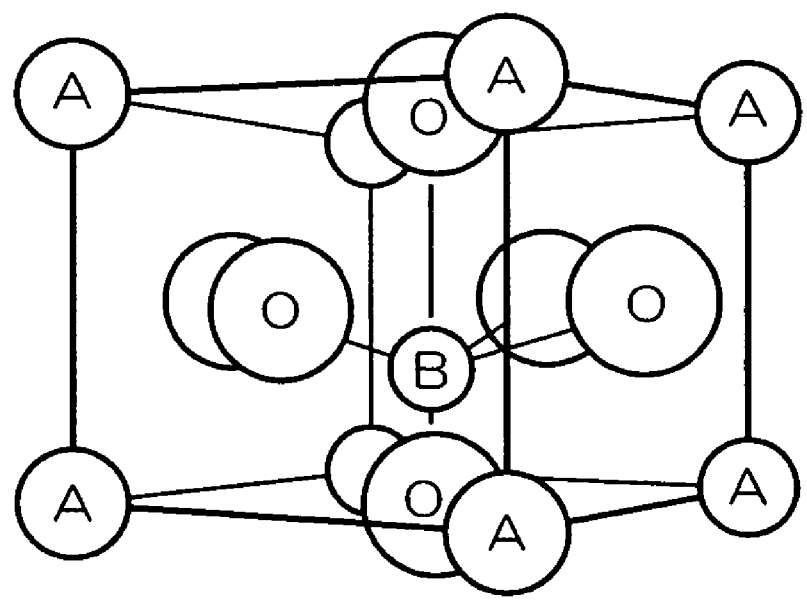

The ferroelectric layer 5 works as a recording material in the ferroelectric memory device 1, and is made of $BiFeO_3$ with a perovskite structure. This ferroelectric layer 5 is grown epitaxially with a tetragonal structure with a (001)-orientation, e.g., of a thickness of 100 nm. Perovskite structures are shown in FIGS. 2A and 2B, where a position indicated by A is an A-site, and a position indicated by B is a B-site. In $BiFeO_3$, a Bi atom is located at an A-site and an Fe atom is located at a B-site. O (oxygen) is located at a position indicated by O in FIGS. 2A and 2B. Since $BiFeO_3$ has such a structure, relative displacements between positive and negative ions, which constitute the crystal, occur, a centrosymmetry of the crystal collapses, consequently an intrinsic polarization is generated, and therefore the $BiFeO_3$ comes to have a hysteresis characteristic when an electric voltage is applied to the $BiFeO_3$. $BiFeO_3$ can work as an involatile memory by utilizing the hysteresis characteristic based on the intrinsic polarization.

In such a $BiFeO_3$ with a perovskite structure, some Fe atoms located at B-sites can be substituted by magnetic metal atoms. It is preferable that such magnetic metal atoms be at least one selected from the group of Mn, Ru, Co, and Ni. By this addition of the magnetic metal atoms, the magnetism of the $BiFeO_3$ ferroelectric layer 5 is strengthened and its dielectric characteristic improves, which can result in higher performance of the ferroelectric memory device 1. It is preferable that Mn atoms or Ru atoms whose ionic radii are larger than that of Fe be added, and by this substitution by these metal atoms, a $BiFeO_3$ layer with a tetragonal structure can grow epitaxially with good quality.

It is preferable that an amount of an addition of the magnetic metal atoms be such that 1-10% of Fe atoms located at all of the B-sites in the crystal structure of the ferroelectric layer 5 is substituted due to the addition. In the case of less than 1%, the substitution cannot improve the magnetism very much, and in the case of more than 10%, it is not expected that the substitution can improve the magnetism more than that of the case of less than 10%. In the case of Mn, Mn atoms can be substituted for 1-30% of Fe atoms located at all of the B-sites in the crystal structure of the ferroelectric layer 5. This is because the magnetism can be improved by the substitution of more than 10%, and up to 30%.

In the $BiFeO_3$, some Fe atoms located at B-sites can be substituted by metal atoms whose valencies are higher than that of Fe. It is preferable that metal atoms whose valencies are higher than that of Fe (+3 value) be selected from the group of V (+5 value), Nb (+5 value), Ta (+5 value), W (+5 value), Ti (+4 value), Zr (+4 value), and Hf (+4 value). In $BiFeO_3$ with a perovskite structure, Bi atoms located at A-sites in the structure evaporate easily and accordingly the A-sites become defects. In a $BiFeO_3$ crystal which has defects of missing Bi atoms at A-sites in the structure, a current leaks easily through the crystal because the $BiFeO_3$ crystal is no longer electrically neutral and no longer electrically insulated. By the substitution of some Fe atoms located at B-sites by metal atoms whose valencies are higher than that of Fe, the $BiFeO_3$ crystal can be maintained neutral and insulated in the entire crystal, which results in the prevention of the current leakage.

It is preferable that an amount of an addition of the metal atoms whose valencies are higher than Fe be such that 1-30% of Fe atoms located at all of the B-sites in the crystal structure of the ferroelectric layer 5 is substituted due to the addition. In the case of less than 1%, the substitution cannot sufficiently improve the prevention of the current leakage, and in the case of more than 30%, it cannot be expected that the substitution can improve the prevention of the current leakage more than that of the case of less than 30%. The upper electrode 6 is made of $SrRuO_3$, and is grown epitaxially with a pseudo cubic system with a (100)-orientation, e.g., of a thickness of 50 nm, which is the same as that of the lower electrode 5. The materials of the upper electrode 6 are not restricted to $SrRuO_3$, and Pt, Ir, $IrO_x$ and other known materials for an electrode can be used.

In manufacturing such a ferroelectric memory device 1, first, an Si substrate 2 with a surface of a (100)-plane is prepared. An Si substrate 2 with uniform thickness, and without deflection and flaws is preferably used. In the present invention, the Si substrate 2 includes an SOI (Si on Insulator) substrate. Such an Si substrate 2 usually has a natural oxide film ($SiO_2$) thereon.

Next, the substrate 2 is loaded on a substrate holder, and these are installed in a vacuum chamber (not shown). In the vacuum chamber, targets (a target for each buffer layer) including constituent elements of the buffer layers 7, 8 and 9, and targets including constituent elements of the lower electrode 4, the ferroelectric layer 5, and the upper electrode 6 are located by being spaced with predetermined distances, and facing the substrate 2. Each target whose composition is the same as or similar to a composition of the first buffer layer 7, the second buffer layer 8, the third buffer layer 9, the lower electrode 4, the ferroelectric layer 5, or the upper electrode 6, is preferably used. Namely, YSZ of a desired composition or a composition similar to that is preferably used as a target for the first buffer layer 7, $CeO_2$ of a desired composition or a composition similar to that is preferably used as a target for the second buffer layer 8, and $YBa_2Cu_3O_x$ of a desired composition or a composition similar to that is preferably used as a target for the third buffer layer 9. $SrRuO_3$ of a desired composition or a composition similar to that is preferably used as both targets for the lower electrode 4 and the upper electrode 6, and a $BiFeO_3$ of a desired composition or a composition similar to that is preferably used as a target for the ferroelectric layer 5.

Figure 3A:
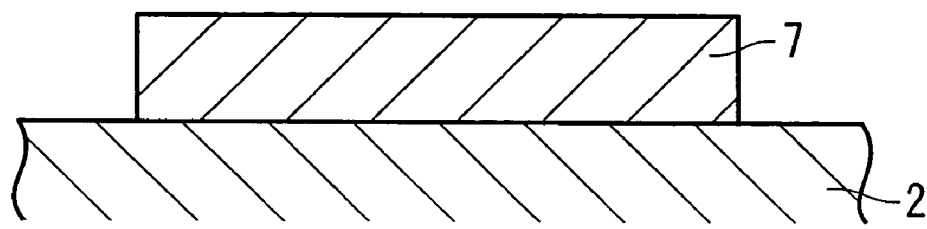
FIGS. 3A, 3B, and 3C show cross sections which schematically show stages of manufacturing the ferroelectric memory device of the present invention.

As described above, the first buffer layer 7 is directly formed on the silicon substrate 2 by an ion beam assist deposition method, as shown in FIG. 3A. Namely, by a laser ablation method in which laser light is irradiated on the target for the first buffer layer 7 and thereby atoms including oxygen atoms and gold atoms are ejected out from the target, and a plume is generated. The plume targets the silicon substrate 2 and makes contact with the silicon substrate 2. At substantially the same time, an ion assist is carried out, namely, an ion beam is irradiated on the surface of the silicon substrate 2 from a predetermined angle described later. By such an ion assist, a YSZ layer grows epitaxially with a cubic system with a (100)-orientation, despite the presence of a natural oxide film on the surface of the silicon substrate 2.

As methods for ejecting constituent atoms of YSZ from the target, besides the method of laser irradiation on the target surface described above, for example, methods of irradiating an argon gas (an inert gas) plasma or electrons on the target surface can be used. However, the method of laser irradiation on the target surface is the most preferable of these methods. According to these methods, atoms can be ejected from the target easily and certainly by using a simple vacuum chamber with a window for laser irradiation.

A pulse laser with a wavelength of 150-300 nm and a pulse duration of 1-100 ns can be preferably used as a laser irradiated on the target. To be concrete, an excimer laser including such as an ArF excimer laser, a KrF excimer laser, and an XeCl excimer laser, a YAG laser, $YVO_4$ laser, and $CO_2$ laser are representatives. An ArF excimer laser or a KrF excimer laser is especially preferable among these. The ArF excimer laser and the KrF excimer laser are both easy to handle and therewith atoms can be ejected more efficiently from the target.

Ions irradiating a surface of the Si substarate 2 in an ion beam assist are not restricted to a specified kind of ion, but at least one kind of ion selected form the group of inert gases such as argon, helium, neon, xenon, and krypton, and ions mixed with one or more of these ions and oxygen ions are preferably used. For example, a Kauffman-type ion source is preferable as an ion beam source, and therewith, an ion beam can be rather easily generated.

The predetermined angle from which an ion beam is irradiated on a surface of the Si substrate 2 is not restricted to a specified angle, but an angle of 35-65 degrees inclined to the surface of the Si substrate 2 is preferable. In the case of forming the first buffer layer 7 made mainly of a metal oxide with an NaCl structure, 42-47 degrees of the irradiation angle is preferable, and in the case of forming a first buffer layer 7 made mainly of a metal oxide with a fluorite structure, 52-57 degrees of the irradiation angle is preferable. In this example, since the first buffer layer 7 is made of YSZ of a metal oxide with a fluorite structure, 52-57 degrees of the irradiation angle, especially around 55 degrees, is used. The first buffer layer 7 in a cubic system with a (100)-orientation with high quality can be formed on the surface of the Si substrate 2 by an irradiation of ion beams with such an irradiation angle to the Si substrate 2.

Ions such as argon ions are irradiated on targets from the <111> direction against the target and, at the same time, a laser ablation is carried out on the targets. When the first buffer layer 7 with a metal oxide with an NaCl structure such as MgO is formed, ions such as argon ions are irradiated on targets from the <110> direction against the target and, at the same time, a laser ablation is carried out on the targets.

Conditions for forming such a first buffer layer 7 are not restricted to specified ones provided that the first buffer layer 7 can grow epitaxially, e.g., the following conditions can be adopted. The frequency of the laser is preferably less than 30 Hz, and more preferably less than 15 Hz. The energy density of the laser is preferably more than 0.5 $J/cm^2$, and more preferably more than 2 $J/cm^2$.

The acceleration voltage is preferably around 100-300 V, and more preferably around 150-250 V. The dose of the ion beam is preferably around 1-30 mA, and more preferably around 5-15 mA.

The temperature of an Si substrate 2 is preferably around 0-50° C., and more preferably around room temperature (5-30° C.). The distance between the Si substrate 2 and the target is preferably less than 60 mm, and more preferably less than 45 mm.

The pressure in the vacuum chamber is preferably less than $133\times10^{-1}$ Pa ($1\times10^{-3}$ Torr), and more preferably less than $133\times10^{-1}$ Pa ($1\times10^{-3}$ Torr). The inert gas-oxygen ratio in an ambient atmosphere in the vacuum chamber is preferably 300:1-10:1 in volume ratio, and more preferably 150:1-50:1. The first buffer layer 7 can grow epitaxially with more efficiency if conditions for formation of the first buffer layer 7 are adopted within the range described above.

The average thickness of the first buffer layer 7 can be adjusted to be the thickness, i.e., around 100 nm by adjusting appropriately the irradiation durations of both the laser and the ion beam. It is usually preferable that these irradiation durations of both the laser and the ion beam be less than 200 seconds, and it is more preferable that they be less than 100 seconds, although these depend on the conditions described above.

According to such a formation method of the first buffer layer 7, the first buffer layer 7 is epitaxially grown in a cubic system with a (100)-orientation, as described above, by using an ion beam assist in which the irradiation of an ion beam can be adjusted, despite the presence of a natural oxide film formed on the surface of the silicon substrate 2. In this way, the directions of orientation of the crystal grains of the first buffer layer 7 can be matched with high precision, and therefore the average thickness of the first buffer layer 7 can become thinner.

Figure 3B:
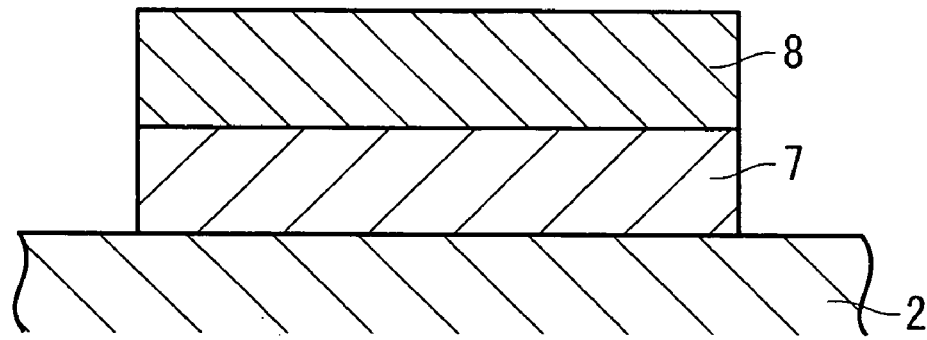

After the first buffer layer 7 is formed in this way, the second buffer layer 8 is formed on the first buffer layer 7, as shown in FIG. 3B. This second buffer layer 8 can be formed only by a laser ablation method, without an ion beam assist, because the second buffer layer 8 is formed on the first buffer layer 7 having a crystal structure with fewer defects, which is different from the case of the formation of the first buffer layer 7 on the natural oxide film. Namely, $CeO_2$ of a desired composition or a composition similar to that is used as the target of the second buffer layer 8, instead of the target for the first buffer layer 7, laser light is irradiated on this target and thereby atoms including oxygen atoms and metal atoms are ejected from the target, and a plume is generated. The plume targets the first buffer layer 7 formed on the silicon substrate 2 and makes contact with the layer 7, and then the second buffer layer 8 grows epitaxially. The conditions, e.g., for laser ablation, and for forming the second buffer layer 8 are the same as those for forming the first buffer layer 7.

Figure 3C:
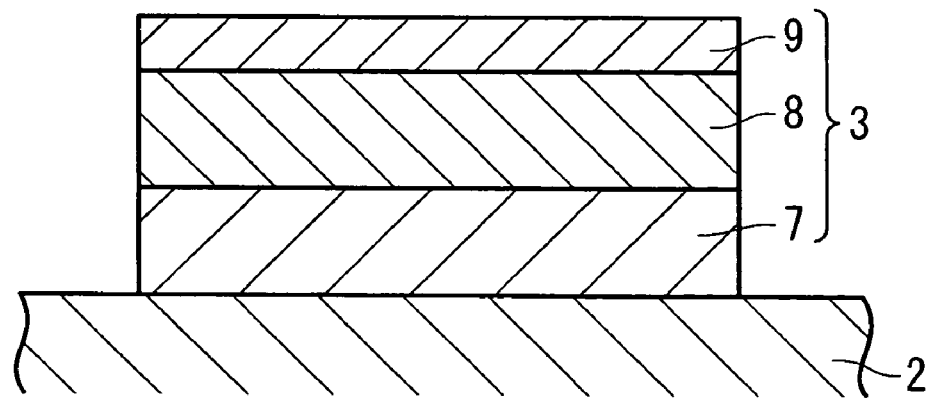

Next, the third buffer layer 9 is formed on the second buffer layer 8, as shown in FIG. 3C, and consequently a buffer layer 3 including the first buffer layer 7, the second buffer layer 8, and the third buffer layer 9 is obtained. This third buffer layer 9 can be formed by a laser ablation method by itself, in the same way as the second buffer layer 8. Namely, $YBa_2Cu_3O_x$ of a desired composition or a composition similar to that is used as the target for the third buffer layer 9, instead of the target for the second buffer layer 8. Laser light is irradiated on this target and thereby atoms including oxygen atoms and metal atoms are ejected from the target, a plume is generated. The plume targets the second buffer layer 8 above the silicon substrate 2 and makes contact with the second buffer layer 8, and then the third buffer layer 9 grows epitaxially.

In the formation of the third buffer layer 9, an ion beam assist can be used if necessary, in the same way as the formation of the second buffer layer 8. Namely, as an ion beam is irradiated on the surface of the second buffer layer 8, the third buffer layer 9 can be formed on the second buffer layer 8. This third buffer layer 9 can be formed more efficiently with the ion beam assist.

The conditions for forming such a third buffer layer 9 are not restricted to specified ones, provided that all kinds of metal atoms can reach the second buffer layer 8 at a desired rate (i.e., the composition of a metal oxide with a perovskite structure) and the third buffer layer 9 can grow epitaxially, e.g., the following conditions can be adopted.

The frequency of the laser is preferably less than 30 Hz, and more preferably less than 15 Hz. The energy density of the laser is preferably more than 0.5 J/cm$^2$, and more preferably more than 2 J/cm$^2$.

The temperature of the Si substrate 2 above which the second buffer layer 8 is formed is preferably around 300-800° C., and more preferably around 700° C. The temperature is preferably around 0-50° C., and more preferably around room temperature (5-30° C.) with the simultaneous use of ion beam irradiation. The distance between the Si substrate 2 above which the second buffer layer 8 is formed and the target is preferably less than 60 mm, and more preferably less than 45 mm.

The pressure in the vacuum chamber is preferably less than 1 atm, where a partial pressure of oxygen of the pressure is preferably around 399×10$^{-3}$ Pa (3×10$^{-3}$ Torr). In the case of the simultaneous use of the ion beam irradiation, the pressure in the vacuum chamber is preferably less than 133×10$^{-1}$ Pa (1×10$^{-1}$ Torr), and more preferably less than 133×10$^{-3}$ Pa (1×10$^{-3}$ Torr). In this case, the inert gas-oxygen ratio in the vacuum chamber is preferably 300:1-10:1 in volume ratio, and more preferably 150:1-50:1.

The third buffer layer 9 can grow epitaxially with more efficiency if the conditions for formation of the third buffer layer 9 are adopted within the range described above. The average thickness of the third buffer layer 9 can be adjusted to be the thickness, i.e., around 30 nm by adjusting appropriately the irradiation durations of both the laser beam and the ion beam. It is usually preferable that the irradiation duration of the laser is around 3-90 minutes, and it is more preferable that it be around 15-45 minutes, although this depends on this conditions described above.

Figure 4A:
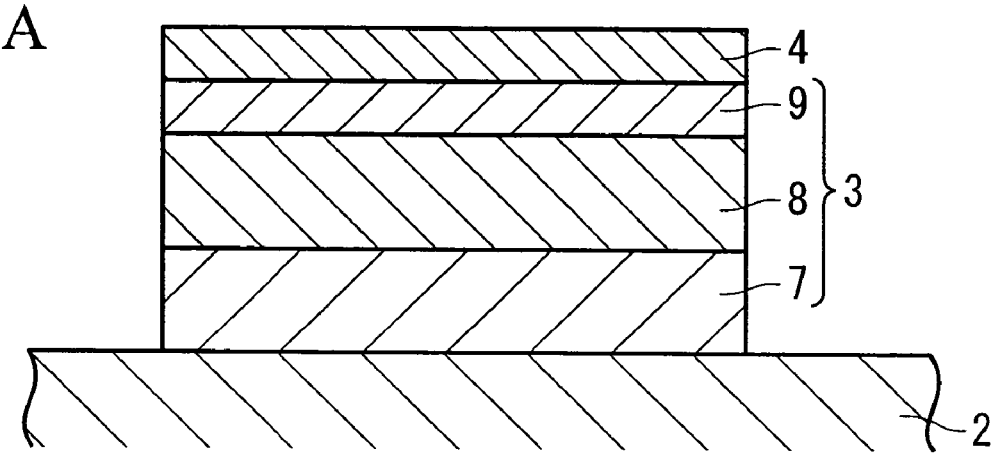
FIGS. 4A, 4B, and 4C show cross sections which schematically show stages of manufacturing the ferroelectric memory device of the present invention.

After the third buffer layer 9 is formed in this way, and thereby the buffer layer 3 is completed, the lower electrode 4 with a perovskite structure is formed on the third buffer layer 9 (buffer layer 3), as shown in FIG. 4A. This lower electrode 4 can be formed only by a laser ablation method by itself, without an ion beam assist, because the lower electrode 4 is formed on the third buffer layer 9 with a perovskite structure with high quality. Namely, SrRuO$_3$ of a desired composition or a composition similar to that is used as the target for the lower electrode 4, instead of the target for the third buffer layer 9, laser light is irradiated on this target and thereby atoms including oxygen atoms and metal atoms are ejected from the target, and a plume is generated. The plume targets the third buffer layer 9 formed above the silicon substrate 2 and makes contact with the layer 9, and then the lower electrode 4 grows epitaxially.

In this embodiment, an electrode with a perovskite structure (lower electrode 4) is formed using an ion beam assist; the lower electrode 4 by itself is not restricted to one formed using an ion beam assist. Namely, if at least a part of the buffer layer 3 (first buffer layer 7 in this embodiment) is formed by an ion beam assist, the lower electrode 4 is formed under the effect of the ion beam assist. The present invention includes not only the case in which the lower electrode 4 is formed directly by an ion beam assist, but also the case in which a base (buffer layer 3) is formed directly by an ion beam assist, and consequently the lower electrode 4 is formed indirectly by an ion beam assist.

The conditions for forming the lower electrode 4 are not restricted to specified ones, provided that all kinds of metal atoms can reach the third buffer layer 9 at a desired rate (i.e., the composition of a metal oxide with a perovskite structure) and the lower electrode 4 can grow epitaxially, e.g., the same conditions, for laser ablation, and for forming the third buffer layer 9, can be applied. In the formation of the lower electrode 4, an ion beam assist can be used if necessary, in the same way as in the formation of the third buffer layer 9. Namely, as an ion beam is irradiated on the surface of the third buffer layer 9, the lower electrode 4 can be formed on the third buffer layer 9. The lower electrode 4 can be formed more efficiently with the ion beam assist.

Figure 4B:
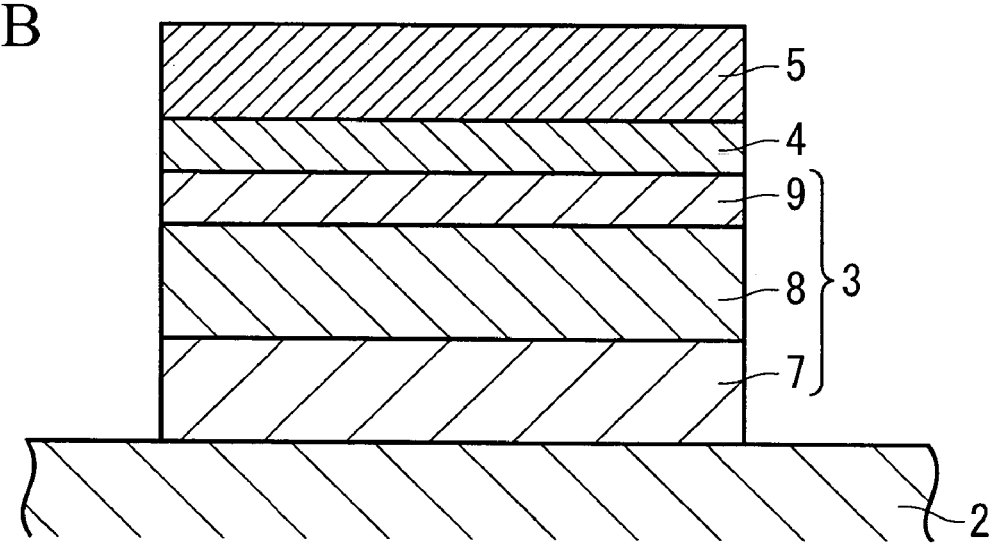

Next, the ferroelectric layer 5 is formed on the lower electrode 4, as shown in FIG. 4B. The (001)-oriented ferroelectric layer 5 with a tetragonal structure with high quality can be formed only by a laser ablation method, without an ion beam assist, because the ferroelectric layer 5 is formed on the lower electrode 4 with a perovskite structure with high quality. Namely, BiFeO$_3$ of a desired composition or a composition similar to that is used as a target of the ferroelectric layer 5, instead of a target for the lower electrode 4, laser light is irradiated on this target and thereby atoms including oxygen atoms and metal atoms are ejected from the target, and a plume is generated. The plume targets the lower electrode 4 formed above the Si substrate 2 and makes contact with the lower electrode 4, and then a (001)-oriented ferroelectric layer 5 with a tetragonal structure grows epitaxially.

BiFeO$_3$ can be used as the target for the ferroelectric layer 5, but BiFeO$_3$, in which some Fe atoms located at B-sites in the structure are substituted by magnetic metal atoms, such as Mn, Ru, Co, and Ni, or metal atoms whose valencies are higher than that of Fe, such as V, Nb, Ta, W, Ti, Zr, and Hf, can be used. A ferroelectric layer 5 with higher performance can be formed using these targets.

Conditions for forming the ferroelectric layer 5 are not restricted to specified ones, provided that all kinds of metal atoms can reach the lower electrode 4 at a desired rate (i.e., the composition of a metal oxide with a perovskite structure) and a ferroelectric layer 5 can grow epitaxially, e.g., the same conditions for laser ablation, and for forming the third buffer layer 9 and the lower electrode 4, can be applied. In the formation of the ferroelectric layer 5, an ion beam assist can be used if necessary, in the same way as in the formation of a third buffer layer 9. Namely, as an ion beam is irradiated on the surface of the lower electrode 4, the ferroelectric layer 5 can be formed on the lower electrode 4. This ferroelectric layer 5 can be formed more efficiently with the ion beam assist.

Figure 4C:
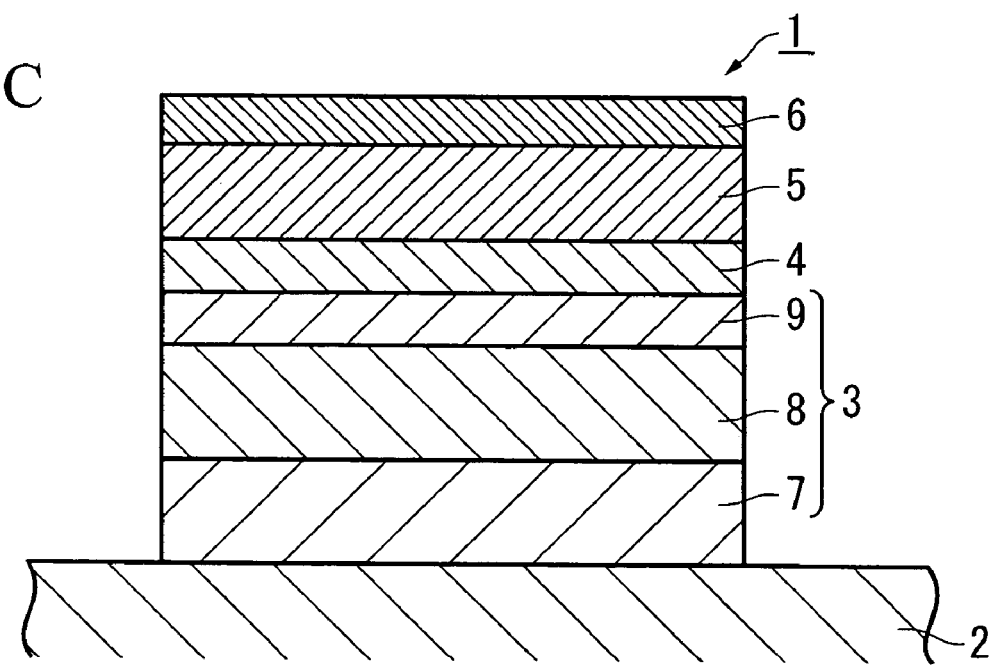

Next, the upper electrode 6 is formed on the ferroelectric layer 5 as shown in FIG. 4C, and the ferroelectric memory device 1 of one embodiment of the present invention is obtained. In the same way as the case of the lower electrode 4 and the ferroelectric layer 5, the (100)-oriented upper electrode 6 with a pseudo cubic system with high quality can be formed only by a laser ablation method, without an ion beam assist, because the upper electrode 6 is formed on the ferroelectric layer 5 with a perovskite structure with high quality. Namely, SrRuO₃ of a desired composition or a composition similar to that is used as the target for the upper electrode 6, instead of a target for the ferroelectric layer 5, laser light is irradiated on this target and thereby atoms including oxygen atoms and metal atoms are ejected from the target, and a plume is generated. The plume targets the ferroelectric layer 5 formed above the Si substrate 2 and makes contact with the ferroelectric layer 5, and then a (100)-oriented upper electrode 6 with a pseudo cubic system grows epitaxially.

The conditions for forming the upper electrode 6 are not restricted to specified ones, provided that all kinds of metal atoms can reach the ferroelectric layer 5 at a desired rate (i.e., the composition of a metal oxide with a perovskite structure) and the upper electrode 6 can grow epitaxially, e.g., the same conditions, for laser ablation, and for forming the third buffer layer 9 and the lower electrode 4, can be applied. In the formation of the upper electrode 6, an ion beam assist can be used if necessary, in the same way as in the formation of the third buffer layer 9. Namely, as an ion beam is irradiated on the surface of the ferroelectric layer 5, the upper electrode 6 can be formed on the ferroelectric layer 5. The upper electrode 6 can be formed more efficiently with the ion beam assist.

X-ray diffraction analysis of the ferroelectric layer 5 in the ferroelectric memory device 1 obtained in this way showed that the ferroelectric layer 5 has a tetragonal structure with a (001)-orientation at room temperature. Therefore, it has been confirmed that the polarization axis of this ferroelectric layer 5 is perpendicular to the upper surface of the Si substrate 2. It has also been confirmed that this ferroelectric layer 5 has high ferroelectric characteristics. Namely, the residual polarization moment Pr of the ferroelectric layer 5 is measured by switching electrical charges at the lower electorode 4 and an upper electorode 6 with an external electric field, and Pr was 60 µC/cm². This ferroelectric layer 5 had a polarization moment up to 280° C. and maintained the ferroelectricity. It has been confirmed that a structural phase transition did not occur down to −40° C. It has been confirmed that the relative variation of the residual polarization moment Pr was within a low range of less than 20% in a temperature range between 0-100° C.

As described above, a ferroelectric layer 5 in the ferroelectric memory device 1 of the present embodiment shows good ferroelectric characteristics, and therefore the ferroelectric memory device 1 has a very high performance. It is possible to directly implement the ferroelectric memory device onto the Si substrate 2 so that it is possible to attain high performance and high-density integration of semiconductor devices including the ferroelectric memory device. Additionally, it is advantageous because the ferroelectric memory device is environmentally preferable because of no inclusion of Pb therein.

Figure 5:
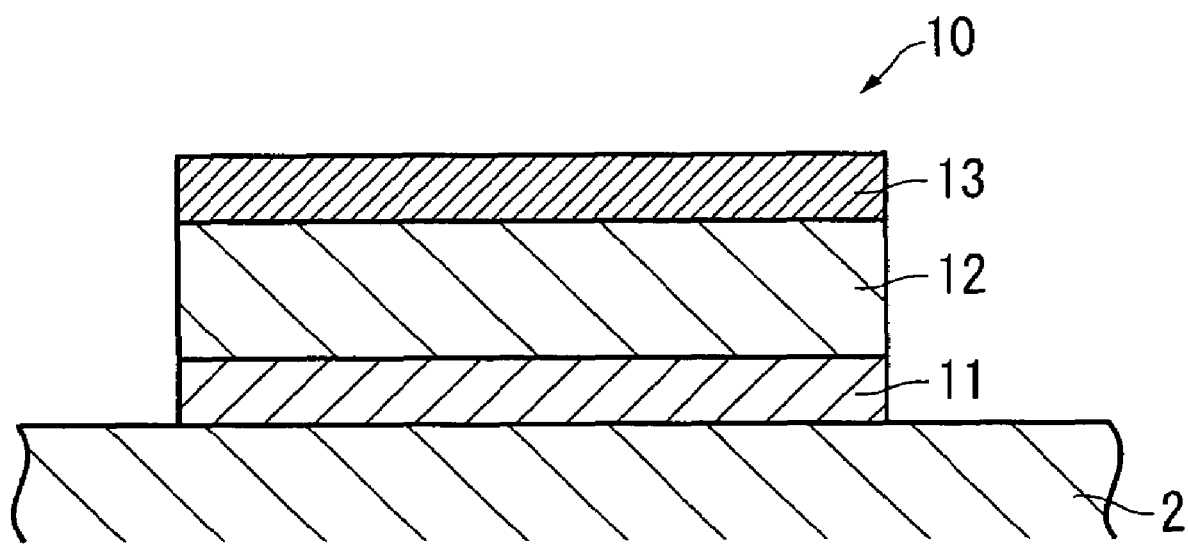
FIG. 5 shows a cross section of another embodiment of the ferroelectric memory device of the present invention.

FIG. 5 shows a schematic illustration of another embodiment of the present ferroelectric memory device, where reference number 10 indicates a ferroelectric memory device 10. The ferroelectric memory device 10 is formed on a (100)-plane of the silicon (Si) substrate 2, and includes a lower electrode 11 formed on the Si substrate 2, a ferroelectric layer 12 formed on the lower electrode 11, and an upper electrode 13 formed on the ferroelectric layer 12.

The lower electrode 11 is an electrode in the present invention, and is made of Pt (platinum) and has a thickness of around 50 nm. Since Pt is oriented in a (111)-orientation regardless of the film formation method, a Pt layer can grow with self-orientation on a natural oxide grown on the Si substrate 2 with a rather simple method such as vacuum deposition.

The ferroelectric layer 12 works as a recording material in the ferroelectric memory device 10, and is made of BiFeO₃ with a perovskite structure, in the same way as the ferroelectric layer 5. This ferroelectric layer 5 is grown epitaxially with a rhombohedral structure with a (111)-orientation, e.g., of a thickness of around 60 nm.

In such a BiFeO₃ with a perovskite structure, some Fe atoms located at B-sites can be substituted by magnetic metal atoms such as Mn, Ru, Co, or Ni described above, in the same way as the ferroelectric layer 5. It is preferable that Mn and Ru whose ionic radii are larger than that of Fe be preferably added, and by this substitution with these metal atoms, a BiFeO₃ layer with a rhombohedral structure can grow epitaxially with good quality. In BiFeO₃, some Fe atoms located at B-sites can be substituted by metal atoms whose valencies are higher than that of Fe. It is preferable that metal atoms whose valencies are higher than that of Fe (+3 value), namely, V (+5 value), Nb (+5 value), Ta (+5 value), W (+5 value), Ti (+4 value), Zr (+4 value), or Hf (+4 value) can be added. The upper electrode 13 in this embodiment is made of Pt with a thickness of around 50 nm, which is grown epitaxially, in the same way as the lower electrode 11.

In manufacturing such a ferroelectric memory device 10, an Si substrate 2 whose surface is a (100)-plane is prepared, in the same way as the previous embodiment. Next, by a vacuum deposition, for example, the lower electrode 11 made of Pt is formed on a natural oxide film formed on the surface of this Si substrate 2. In this way, a Pt layer can grow easily with self-orientation of a (111)-orientation on the Si substrate 2 (on a natural oxide). Known general conditions for the formation of a film can be applied to conditions for forming this lower electrode 11, that is, the conditions for the formation of a Pt film.

Next, the ferroelectric layer 12 is formed on the lower electrode 11. A (111)-oriented ferroelectric layer 12 with a rhombohedral structure with high quality can be formed by a laser ablation method, because the ferroelectric layer 12 is formed on the lower electrode 11 with a (111)-orientation. Namely, BiFeO₃ of a desired composition or a composition similar to that is used as the target for the ferroelectric layer 12, laser light is irradiated on this target and thereby atoms including oxygen atoms and metal atoms are ejected from the target, and a plume is generated. The plume targets the lower electrode 11 formed above the Si substrate 2 and makes contact with the lower electrode 11, and then a (111)-oriented ferroelectric layer 12 with a rhombohedral structure grows.

The same targets for the ferroelectric layer 5 can be applied as targets for the ferroelectric layer 12. The conditions for forming the ferroelectric layer 5 can also be applied to conditions for forming the ferroelectric layer 12. For forming the ferroelectric layer 12, an ion beam assist can be used if necessary. Namely, as an ion beam is irradiated on the surface of the lower electrode 11, the ferroelectric layer 12 can be formed on the lower electrode 11. The ferroelectric layer 12 can be formed more efficiently with the ion beam assist.

Next, the upper electrode 13 is formed on the ferroelectric layer 12 and a ferroelectric memory device 10 of the present invention is obtained. Since this upper electrode 13 is formed of Pt in the same way as the lower electrode 11, this formation can be carried out by sputtering in the same way as the formation of the lower electrode 11.

X-ray diffraction analysis of the ferroelectric layer 12 in the ferroelectric memory device 10 obtained in this way shows that the ferroelectric layer 12 has a rhombohedral structure with a (111)-orientation at a room temperature. Therefore, it has been confirmed that the polarization axis of this ferroelectric layer 12 is perpendicular to the upper surface of the Si substrate 2. It has also been confirmed that this ferroelectric layer 12 has high ferroelectric characteristics. Namely, the residual polarization moment Pr of the ferroelectric layer 12 is measured by switching electrical charges at the lower electorode 11 and the upper electorode 13 with an external electric field, and Pr was 20 μC/cm². This ferroelectric layer 12 had a polarization moment up to 270° C. and maintained the ferroelectricity. It has been confirmed that a structural phase transition did not occur down to −40° C. It has been confirmed that relative variation of a residual polarization moment Pr was within a low range of less than 20% in a range between 0-100° C.

As described above, the ferroelectric layer 12 in the ferroelectric memory device 10 of the present embodiment shows good ferroelectric characteristics, and therefore the ferroelectric memory device 10 has a very high performance. It is possible to directly implement the ferroelectric memory device into the Si substrate 2 so that it is possible to attain high performance and high-density integration of semiconductor devices including the ferroelectric memory device. Additionally, it is advantageous because the ferroelectric memory device 10 is environmentally preferable because of no inclusion of Pb therein.

In this ferroelectric memory device 10, the material for the upper electrode 13 is not restricted to Pt, but other known electrode materials such as Ir, $IrO_x$, and $SrRuO_3$ can be used. The material for the upper electrode 11 is not restricted to Pt with a (111)-orientation, but other electrode materials with a perovskite structure with a (111)-orientation can be used.

In the case in which another electrode with a perovskite structure with a (111)-orientation is used as the lower electrode 11, it is advantageous that this electrode is formed on the buffer layer with a (111)-orientation by self-orientation. Namely, the buffer layer 3 is formed on the Si substrate 2, and the lower electrode 11 is formed on this buffer layer 3.

The buffer layer 3 is formed of YSZ with a (111)-orientation by self-orientation. Namely, since YSZ has a fluorite structure and metal atoms in the structure are arranged with a face-centered cubic structure, it easily takes a self-orientation with a (111)-orientation. In the same way as the previous embodiment, the first buffer layer 7 of YSZ with a (111)-orientation is formed by laser ablation, and the second buffer layer 8 and third buffer layer 9 are formed of transition metal oxides with a (111)-plane. In another method of forming the buffer layer 3, the buffer layer 3 is formed of ZnO with a hexagonal structure with a (0001) self-orientation. As the same as the previous embodiment, the first buffer layer 7 of ZnO with a hexagonal structure with a (0001) self-orientation is formed by a laser ablation, and the second buffer layer 8 and third buffer layer 9 are formed of transition metal oxides with a (111)-plane.

After the buffer layer 3 is formed in this way, the (111)-oriented lower electrode 11 with a perovskite structure of a thickness of around 50 nm is grown epitaxially on the third buffer layer 9. The materials for forming the third buffer layer 9 in the previous embodiment can be applied for forming this lower electrode 11 with a perovskite structure grown epitaxially, and especially at least one of $SrRuO_3$, Nb—$SrTiO_3$, La—$SrTiO_3$, and (La, Sr)$CoO_3$ can be preferably applied. These metal oxides have good electric conductivity and good chemical stability, and therefore the lower electrode 11 made of these metal oxides has good electric conductivity and good chemical stability. Additionally, a (111)-oriented $BiFeO_3$ ferroelectric layer with a rhombohedral structure with good quality can be formed on the lower electrode 11. In this example, $SrRuO_3$ with a (111)-orientation is used.

A laser ablation method is used in the formation of the lower electrode 11, and an ion beam assist can be used if necessary. Namely, as an ion beam is irradiated on the surface of the third buffer layer 9, a lower electrode 11 can be formed on the third buffer layer 9. This lower electrode 11 can be formed more efficiently with the ion beam assist. Also in the case in which a (111)-orientated electrode with a perovskite structure is used as the lower electrode 11, the ferroelectric layer 12 and upper electrode 13 are formed above this lower electrode 11, as described above.

X-ray diffraction analysis of the ferroelectric layer 12 in the ferroelectric memory device 1 in which the (111)-oriented lower electrode 11 with a perovskite structure formed on the buffer layer 3 shows that the ferroelectric layer 12 has a rhombohedral structure with a (111)orientation at room temperature. Therefore, it has been confirmed that the polarization axis of this ferroelectric layer 12 is perpendicular to the upper surface of the Si substrate 2. It has also been confirmed that this ferroelectric layer 12 has high ferroelectric characteristics, in the same way as the previous embodiment in which Pt is used as the lower electrode 11.

Figure 6:
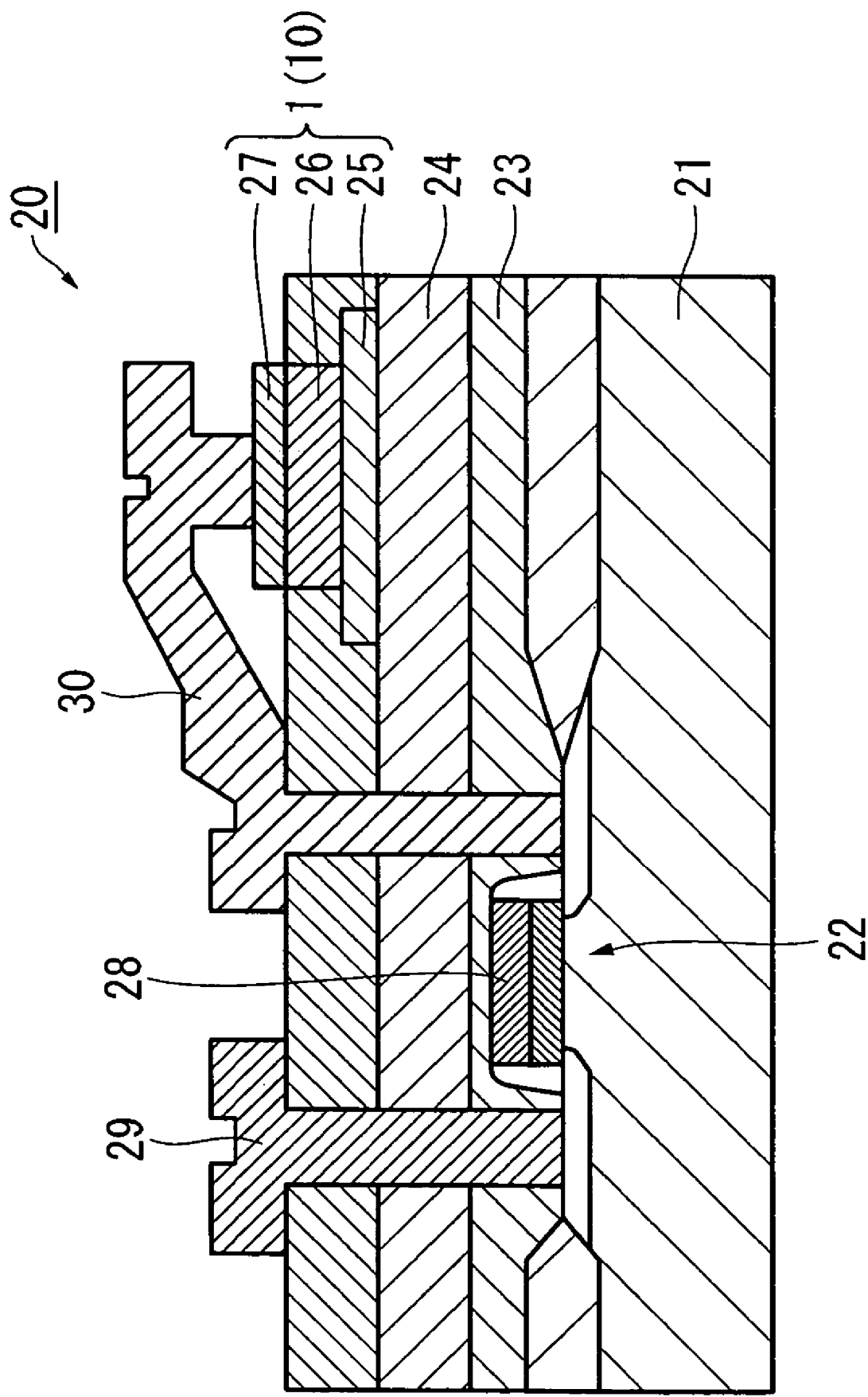
FIG. 6 shows a cross section of an example of a planar-type ferroelectric memory device.

FIG. 6 shows a schematic illustration of an example of a planar-type ferroelectric memory device in which the ferroelectric memory device 1 (10) is applied as a capacitor. Reference number 20 in FIG. 6 indicates a planar-type ferroelectric memory device. In the planar-type ferroelectric memory device 20, an MOS transistor 22 is formed on an Si substrate 21, and a first interlayer dielectric 23, second interlayer dielectric 24, and the ferroelectric memory device 1 (10) are formed in turn above the MOS transistor 22. In this figure, only a lower electrode 25, a ferroelectric layer 26, and an upper electrode 27 are shown, and the buffer layer 3 can be formed if necessary.

In the MOS transistor 22, its gate corresponds to a word line 28. A bit line 29 is connected to one source-drain region and a local line 30 is connected to another source-drain region, and the upper electrode 27 is connected to the local line 30. In this planar-type ferroelectric memory device 20 with such a constitution, the ferroelectric memory device 1 (10) is controlled by the MOS transistor 22, and writing and reading are carried out by its high speed inversion characteristic.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A ferroelectric memory device comprising:
   an Si oxide film;
   an electrode made of a perovskite material of at least one of Nb—$SrTiO_3$ and La—$SrTiO_3$ and formed on the Si oxide film; and
   a (001)-oriented $BiFeO_3$ ferroelectric layer with a tetragonal structure formed on the electrode.

2. A ferroelectric memory device according to claim 1, wherein the electrode made of a perovskite material is formed by an ion beam assist deposition method.

3. A ferroelectric memory device according to claim 1, wherein the electrode made of a perovskite material is epitaxially grown with a (100)-orientation.

4. A ferroelectric memory device according to claim 1, wherein the electrode made of a perovskite material is formed on a buffer layer which is formed on a substrate by an ion beam assist deposition method.

5. A ferroelectric memory device according to claim 4, wherein the buffer layer is epitaxially grown with a (100)-orientation.

6. A ferroelectric memory device according to claim 1, wherein the $BiFeO_3$ ferroelectric layer has a perovskite structure, in which some Fe atoms located at B-sites in the structure are substituted by magnetic metal atoms.

7. A ferroelectric memory device according to claim 6, wherein the magnetic metal atoms are at least one selected from the group of Mn, Ru, Co, and Ni.

8. A ferroelectric memory device according to claim 6, wherein the magnetic metal atoms are substituted for 1-10% of Fe atoms located at all of the B-sites in the $BiFeO_3$ ferroelectric layer.

9. A ferroelectric memory device according to claim 6, wherein the $BiFeO_3$ ferroelectric layer has a perovskite structure, in which some Fe atoms located at B-sites are substituted by metal atoms whose valencies are higher than that of Fe.

10. A ferroelectric memory device according to claim 9, wherein the metal atoms whose valencies are higher than that of Fe are at least one selected from the group of V, Nb, Ta, W, Ti, Zr, and Hf.

11. A ferroelectric memory device according to claim 9, wherein the metal atoms which valencies are higher than Fe are substituted for 1-30% of Fe atoms located at all of the B-sites in the $BiFeO_3$ ferroelectric layer.

* * * * *